United States Patent
Kim

(10) Patent No.: US 10,216,053 B2
(45) Date of Patent: Feb. 26, 2019

(54) AMORPHOUS SILICON THIN FILM TRANSISTOR-LIQUID CRYSTAL DISPLAY DEVICE AND METHOD OF MANUFACTURING THE SAME

(71) Applicant: SAMSUNG DISPLAY CO., LTD., Yongin-si, Gyeonggi-Do (KR)

(72) Inventor: Dong-Gyu Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 122 days.

(21) Appl. No.: 15/277,266

(22) Filed: Sep. 27, 2016

(65) Prior Publication Data

US 2017/0017106 A1    Jan. 19, 2017

Related U.S. Application Data

(60) Continuation of application No. 14/140,220, filed on Dec. 24, 2013, now Pat. No. 9,454,049, which is a
(Continued)

(30) Foreign Application Priority Data

May 28, 2002 (KR) ........................ 10-2002-0029664

(51) Int. Cl.
*G02F 1/1345* (2006.01)
*G09G 3/36* (2006.01)
(Continued)

(52) U.S. Cl.
CPC ........ *G02F 1/13454* (2013.01); *G02F 1/1368* (2013.01); *G02F 1/13439* (2013.01);
(Continued)

(58) Field of Classification Search
CPC ............ G02F 1/13454; G02F 1/13458; G02F 1/13439; G02F 1/136227;
(Continued)

(56) References Cited

U.S. PATENT DOCUMENTS

| 5,940,151 A * | 8/1999 | Ha ...................... G02F 1/13454 257/59 |
| 6,580,423 B1 * | 6/2003 | Murade ................ G09G 3/3688 257/72 |

(Continued)

*Primary Examiner* — Christopher E Leiby
(74) *Attorney, Agent, or Firm* — F. Chau & Associates, LLC

(57) ABSTRACT

In an amorphous silicon thin film transistor-liquid crystal display device and a method of manufacturing the same, gate patterns including a gate line and a gate electrode are formed on an insulation substrate having a display region and a driving circuit region on which a plurality of shift resistors are formed. A gate insulating film, active layer patterns and data patterns including source/drain electrodes are formed successively on the substrate. A passivation layer on the substrate has a first contact hole exposing a drain electrode of the display region and second and third contact holes respectively exposing a gate electrode and source/drain electrode of a first transistor of each of the shift resistors. Electrode patterns on the passivation layer include a first electrode connected to the drain electrode of the display region through the first contact hole and a second electrode connecting the gate electrode to the source/drain electrode of the first transistor through the second and third contact holes. The gate driving circuit including the shift resistors and the wirings are integrated on the insulating substrate without an additional process, thereby simplifying the manufacturing process.

20 Claims, 15 Drawing Sheets

Related U.S. Application Data continuation of application No. 12/108,337, filed on Apr. 23, 2008, now Pat. No. 8,619,207, which is a division of application No. 11/177,113, filed on Jul. 8, 2005, now Pat. No. 7,379,148, which is a continuation of application No. 10/293,095, filed on Nov. 13, 2002, now Pat. No. 6,922,217.

(51) Int. Cl.

| | |
|---|---|
| *G11C 19/28* | (2006.01) |
| *G02F 1/1343* | (2006.01) |
| *H01L 29/66* | (2006.01) |
| *G02F 1/1368* | (2006.01) |
| *H01L 27/12* | (2006.01) |
| *H01L 29/786* | (2006.01) |
| *G02F 1/1362* | (2006.01) |

(52) U.S. Cl.
CPC ....... *G02F 1/13458* (2013.01); *G09G 3/3677* (2013.01); *G11C 19/28* (2013.01); *H01L 27/124* (2013.01); *H01L 27/1222* (2013.01); *H01L 27/1248* (2013.01); *H01L 29/66765* (2013.01); *H01L 29/78669* (2013.01); *G02F 1/136227* (2013.01); *G02F 2001/136295* (2013.01); *G02F 2201/123* (2013.01); *G02F 2201/50* (2013.01); *G02F 2202/103* (2013.01); *G09G 2300/0408* (2013.01)

(58) Field of Classification Search
CPC ... G02F 2001/136295; G02F 2202/103; G02F 2201/50; G02F 2201/123; G09G 3/3677; G09G 2300/0408; G11C 19/28; H01L 29/66765; H01L 27/1222; H01L 27/1248; H01L 27/124
See application file for complete search history.

(56) References Cited

U.S. PATENT DOCUMENTS

| | | | |
|---|---|---|---|
| 6,603,453 B2 * | 8/2003 | Yamazaki | ............ H01L 27/124 345/92 |
| 6,922,217 B2 | 7/2005 | Kim | |
| 7,379,148 B2 | 5/2008 | Kim | |
| 8,330,492 B2 * | 12/2012 | Umezaki | .................. G09G 3/20 326/102 |
| 8,619,207 B2 | 12/2013 | Kim | |
| 2007/0019146 A1 * | 1/2007 | Yamazaki | ............ G09G 3/3648 349/151 |
| 2014/0106515 A1 | 4/2014 | Kim | |

\* cited by examiner

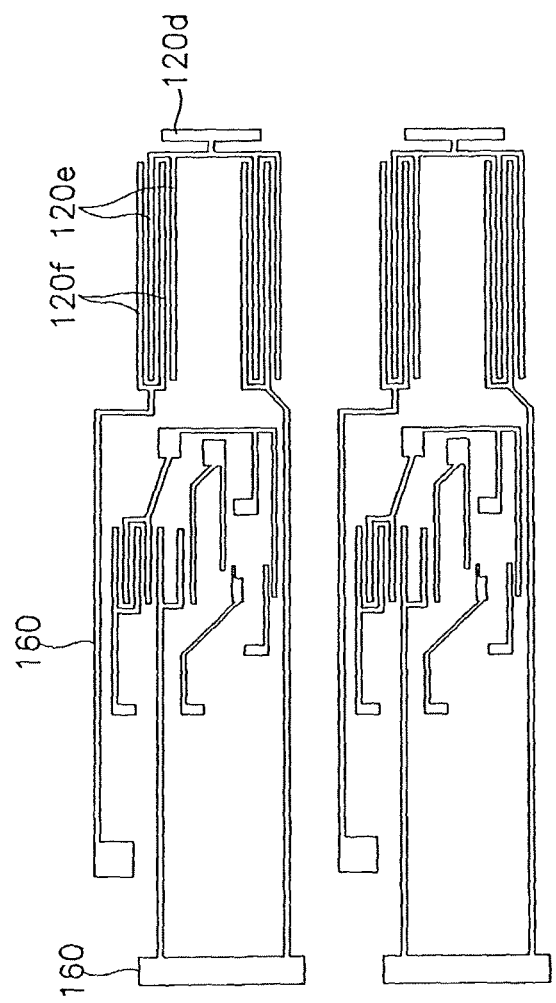

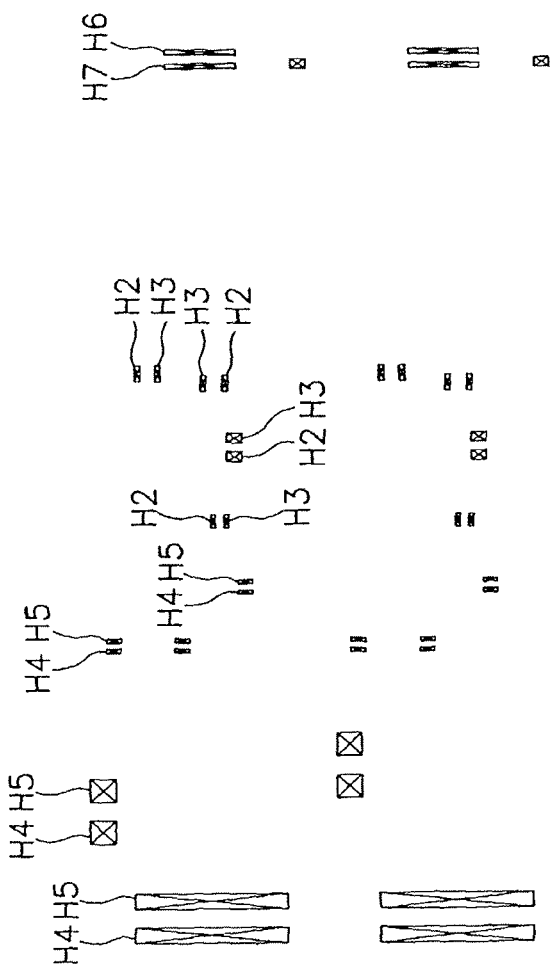

FIG. 10B
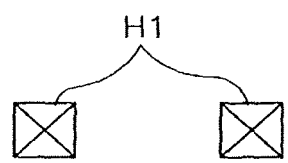
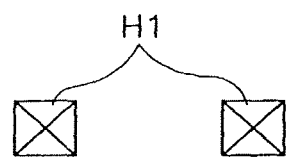

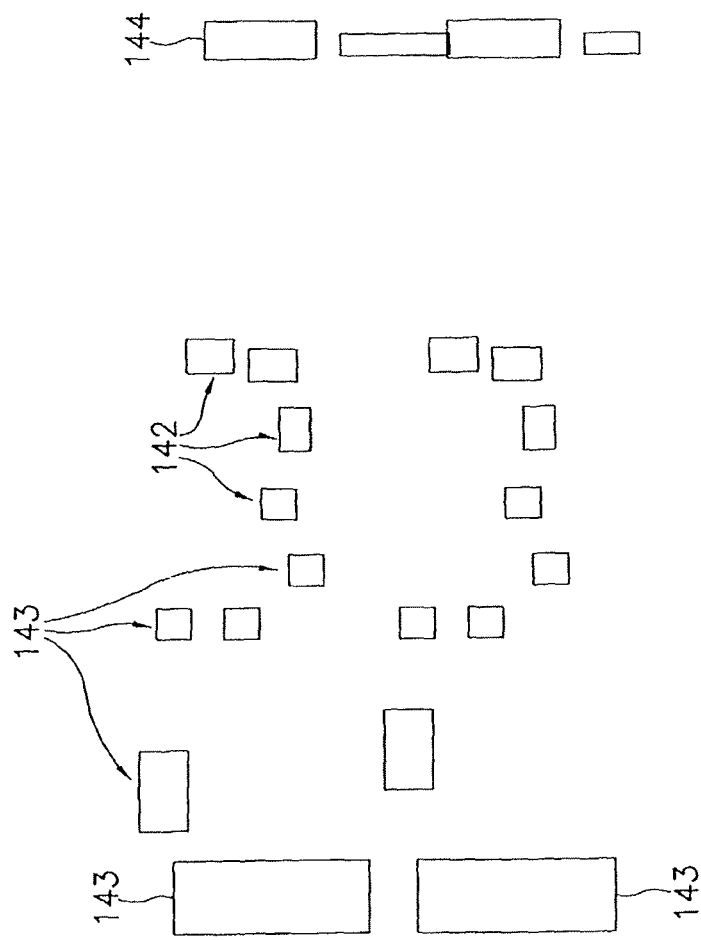

AMORPHOUS SILICON THIN FILM TRANSISTOR-LIQUID CRYSTAL DISPLAY DEVICE AND METHOD OF MANUFACTURING THE SAME

CROSS-REFERENCE TO RELATED APPLICATIONS

This application is a continuation of U.S. application Ser. No. 14/140,220, filed on Dec. 24, 2013, which is a continuation of U.S. patent application Ser. No. 12/108,337, filed on Apr. 23, 2008, which is a Divisional patent application of U.S. patent application Ser. No. 11/177,113, filed on Jul. 8, 2005, which is a continuation of U.S. application Ser. No. 10/293,095 filed on Nov. 13, 2002, now U.S. Pat. No. 6,922,217, which claims priority from Korean Patent Application No. 10-2002-29664, filed on May 28, 2002, the disclosures of which are herein incorporated by reference in their entirety.

BACKGROUND OF THE INVENTION

Field of the Invention

The present invention relates to a liquid crystal display device and a method of manufacturing the same and, more particularly, to an amorphous silicon thin film transistor-liquid crystal display device (TFT-LCD) in which a gate driving circuit is integrated on an amorphous silicon TFT substrate and a method of manufacturing the same.

Description of the Related Art

In the information society of these days, electronic display devices are more important as information transmission media and various electronic display devices are widely applied for industrial apparatus or home appliances. Such electronic display devices are being continuously improved to have new appropriate functions for various demands of the information society.

In general, electronic display devices display and transmit various pieces of information to users who utilize such information. That is, the electronic display devices convert electric information signals outputted from electronic apparatus into light information signals recognized by users through their eyes.

In the electronic display devices dividing into an emissive display device and a non-emissive display device, the emissive display device displays light information signals through a light emission phenomena thereof and the non-emissive display device displays the light information signals through a reflection, a scattering or an interference thereof. The emissive display device includes a cathode ray tube (CRT), a plasma display panel (PDP), a light emitting diode (LED) and an electroluminescent display (ELD). The emissive display device is called as an active display device. Also, the non-emissive display device, called as a passive display device, includes a liquid crystal display (LCD), an electrochemical display (ECD) and an electrophoretic image display (EPID).

The CRT has been used for a television receiver or a monitor of a computer as the display device for a long time since it has a high quality and a low manufacturing cost. The CRT, however, has some disadvantages such as a heavy weight, a large volume and high power dissipation.

Recently, the demand for a new electronic display devices is greatly increased such as a flat panel display device having excellent characteristics that thin thickness, light weight, low driving voltage and low power consumption. Such flat panel display devices can be manufactured according to the rapidly improved semiconductor technology.

In the flat panel devices, a liquid crystal display (LCD) device has been widely utilized for various electronic devices because the LCD device has a thin thickness, a low power dissipation and high display quality approximately identical to those of the CRT. Also, the LCD device can be operated under a low driving voltage and can be easily manufactured so that the LCD device is widely used for various electronic apparatuses.

The LCD comprises two substrates, each of the substrates having an electrode, and a liquid crystal layer interposed therebetween. In the LCD, a voltage is applied to the electrodes to realign liquid crystal molecules and control an amount of light transmitted through the molecules.

Among the LCDs, there is mainly used a device including electrodes formed on each of two substrates and a thin film transistor for switching a voltage applied to each of the electrodes. Generally, the thin film transistor is formed on one of the two substrates.

The LCD device utilizing the thin film transistor in a pixel region is divided into an amorphous type TFT-LCD and a polycrystalline type TFT-LCD. The polycrystalline silicon TFT-LCD device has low consumption power and cost, but the TFT manufacturing process is complicated as compared to that of the amorphous silicon TFT-LCD device. Accordingly, the polycrystalline silicon TFT-LCD is mainly used for a small-sized display such as IMT-2000 mobile phone. The amorphous silicon TFT-LCD is suitable for a large-sized display and has a high yield, so is used for display having a large screen such as a notebook PC, an LCD monitor, a high definition television (HDTV) receiver, etc.

As shown in FIG. 1, in a polycrystalline silicon TFT-LCD device, a data driving circuit 12 and a gate driving circuit 14 are formed on a glass substrate 10 on which pixel arrays are formed. A terminal 16 is connected to an integrated printed circuit board (PCB) 20 through a film cable 18. This structure can cut down manufacturing cost and minimize the power loss by integrating the driving circuits.

However, as shown in FIG. 2, in an amorphous silicon TFT-LCD device, a data driving chip 34 is formed on a flexible PCB 32 by a chip on film (COF) method and a data PCB 36 is connected to a data line terminal of pixel array through the flexible PCB 32. Further, a gate driving chip 40 is formed on a flexible PCB 38 by the COF method, and a gate PCB 42 is connected to a gate line terminal of pixel array through the flexible PCB 38.

A recently suggested method is an integrated PCB technology wherein a gate power supply is mounted on a data PCB to thereby eliminate a gate PCB. In a Korea Patent Laid-Open Publication Number 2000-66493, there is disclosed an LCD module adopting an integrated PCB from which the gate PCB is removed.

However, even if the integrated PCB is adopted, a flexible PCB on which a gate driving circuit is formed is still used. Accordingly, since a process of assembling a plurality of flexible PCBs on a glass substrate is carried out in the manufacture of amorphous silicon TFT-LCD, an outer lead bonding (OLB) process is more complicated as compared to the polycrystalline silicon TFT-LCD, thereby raising the manufacturing cost.

Therefore, for the amorphous silicon TFT-LCD, it is demanded a method where the driving circuits and the pixel array are simultaneously formed on the substrate to thereby decrease the number of the assembly process in the same manner of the polycrystalline silicon TFT-LCD.

SUMMARY OF THE INVENTION

It is an object of the present invention to provide an amorphous silicon TFT-LCD device in which a gate driving circuit is integrated on an amorphous silicon TFT substrate.

It is another object of the present invention to provide a method of manufacturing an amorphous silicon TFT-LCD device in which a gate driving circuit is integrated on an amorphous silicon TFT substrate.

To achieve the object of the present invention, there is provided an amorphous silicon TFT-LCD device comprising an insulating substrate including a display region on which a pixel array is formed and a driving circuit region on which a plurality of shift resistors are formed. A gate pattern is formed on the substrate and includes a gate line and a gate electrode. A gate insulating film is formed on the substrate including the gate pattern. An active layer pattern is formed on the gate insulating film and a data pattern is formed on the substrate and the active layer pattern. The data pattern includes a source electrode making contact with a first region of the active layer pattern, a drain electrode making contact with a second region of the active layer pattern and a data line connected to the drain electrode. A passivation layer is formed on the substrate including the data pattern and has a first contact hole exposing the drain electrode of the display region, a second contact hole exposing the gate electrode of a first transistor of each of the shift resistors and a third contact hole exposing the source/drain electrode of the first transistor. An electrode pattern is formed on the passivation layer and includes a first electrode connected to the drain electrode of the display region through the first contact hole and a second electrode connecting the gate electrode and the source/drain electrode of the first transistor to each other through the second and third contact holes.

Further, the aforementioned object of the present invention can achieved by an amorphous silicon TFT-LCD device comprising an insulating substrate including a display region on which a plurality of gate lines and a plurality of data lines are formed and a gate driving circuit region. A plurality of shift resistors is formed on the substrate of the gate driving circuit region and includes n number of thin film transistors having a gate electrode and source/drain electrodes. The shift resistors select sequentially a plurality of gate lines. Main wirings are disposed on the substrate of the gate driving circuit region in order to apply a signal to each of the shift resistors and formed of the same layer from a first shift resistor to a last shift resistor. A passivation layer is formed on the substrate including the shift resistors and the main wirings and has a first contact hole partially exposing a data line of the display region, a second contact hole exposing a gate electrode of a first transistor of each of the shift resistors and a third contact hole exposing the source/drain electrode of the first transistor. An electrode pattern is formed on the passivation layer and includes a first electrode connected with the data line of the display region through the first contact hole and a second electrode connecting the gate electrode and the source/drain electrode of the first transistor to each other through the second and third contact holes.

To achieve another object of the present invention, there is provided a method of manufacturing an amorphous silicon TFT-LCD device. After forming a gate pattern including a gate line and a gate electrode on an insulating substrate having a display region on which a pixel array is formed and a driving circuit region on which a plurality of shift resistors are formed, a gate insulating film is formed on the substrate including the gate pattern. An active layer pattern is formed on the gate insulating film above the gate electrode. A data pattern is formed on the substrate and the active layer pattern. The data pattern includes a source electrode making contact with a first region of the active layer pattern, a drain electrode making contact with a second region of the active layer pattern and a data line connected with the drain electrode. After forming a passivation layer on the substrate including the data pattern, the passivation layer and the gate insulating film are etched to form a first contact hole exposing the drain electrode of the display region, a second contact hole exposing the gate electrode of a first transistor of each of the shift resistors, and a third contact hole exposing a source/drain electrode of the first transistor. Thereafter, an electrode pattern is formed on the passivation layer. The electrode pattern includes a first electrode connected with the drain electrode of the display region through the first contact hole and a second electrode connecting the gate electrode and the source/drain electrode of the first transistor to each other through the second and third contact holes.

Also, another object of the present invention can be achieved by a method of manufacturing an amorphous silicon TFT-LCD device wherein a gate pattern is formed. The gate pattern includes a gate line and a gate electrode on an insulating substrate having a display region on which a pixel array is formed and a driving circuit region on which a plurality of shift resistors are formed. After forming a gate insulating film on the substrate including the gate pattern, an active layer pattern and a data pattern on the gate insulating film using one mask are formed. The data pattern includes a source electrode making contact with a first region of the active layer pattern, a drain electrode making contact with a second region of the active layer pattern and a data line connected with the drain electrode. A passivation layer is formed on the substrate including the data pattern. The passivation layer and the gate insulating film are etched to form a first contact hole exposing the drain electrode of the display region, a second contact hole exposing the gate electrode of a first transistor of each of the shift resistors, and a third contact hole exposing a source/drain electrode of the first transistor. Then, an electrode pattern is formed on the passivation layer. The electrode pattern includes a first electrode connected with the drain electrode of the display region through the first contact hole and a second electrode connecting the gate electrode and the source/drain electrode of the first transistor to each other through the second and third contact holes.

According to an amorphous silicon TFT-LCD device of the present invention, without an additional process, the gate driving circuit including the shift resistors and the wirings is integrated on the insulating substrate on which a pixel array is formed. That is, several layers, which can be comprised of the same material, are formed of the same layer to thereby decrease the number of mask. Further, a conductive film for pixel electrode connects the gate electrode and source/drain electrodes of the first transistor constituting the shift resistors in the gate driving circuit with each other, thereby simplifying the manufacturing process.

Further, the main wirings for applying a signal to each of the shift resistors are formed of the same layer from the first shift resistor to the last shift resistor, so that the resistance of the main wiring is minimized to increase field effect mobility of the amorphous silicon TFT-LCD.

BRIEF DESCRIPTION OF THE INVENTION

The above objects and other advantages of the present invention will become more apparent by describing preferred embodiments thereof in detail with reference to the accompanying drawings in which:

FIGS. 8A, 8B, 9A, 9B, 10A, 10B, 11A, and 11B are plan views illustrating a method of manufacturing an amorphous silicon TFT-LCD device in accordance with one embodiment of the present invention.

DESCRIPTION OF THE PREFERRED EMBODIMENTS

Hereinafter, a preferred embodiment of the present invention will be described in detail with reference to the accompanying drawings.

Figure 1:
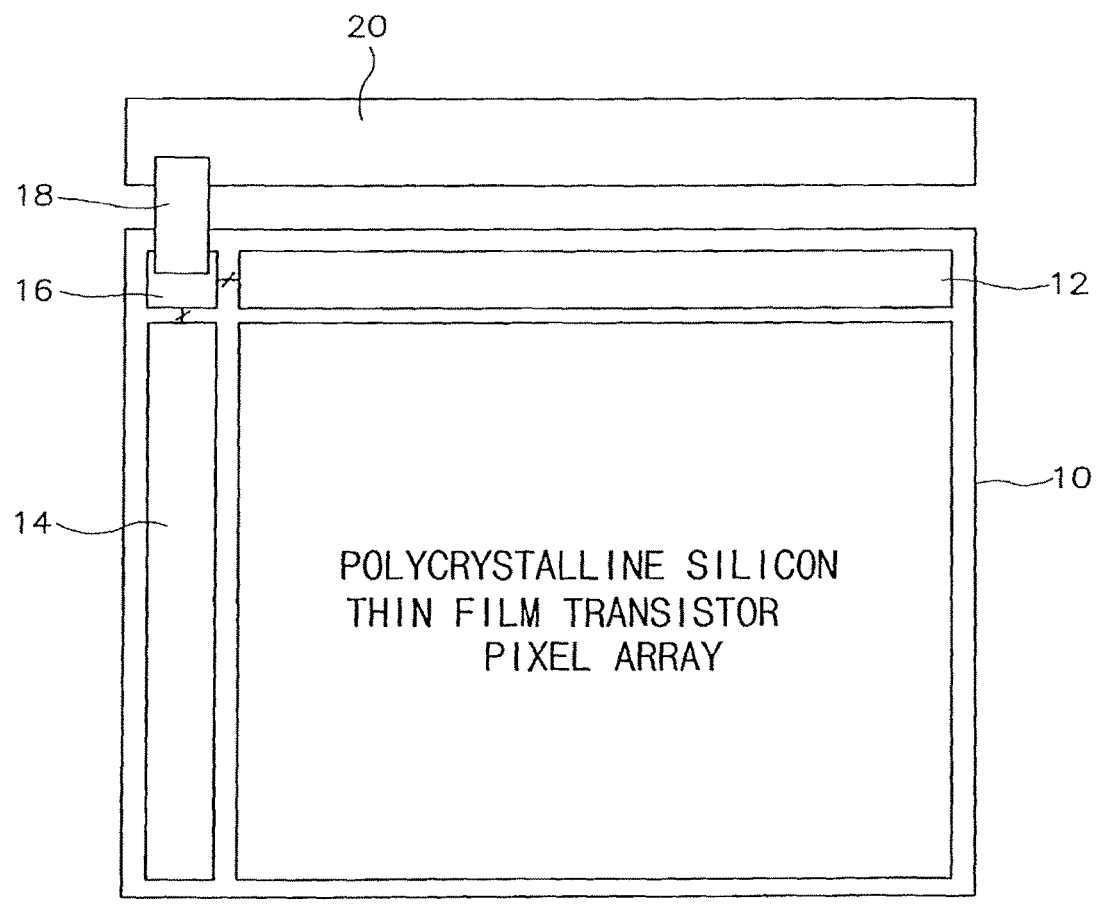
FIG. 1 is a plan view schematically illustrating a conventional polycrystalline silicon TFT-LCD device.
Figure 2:
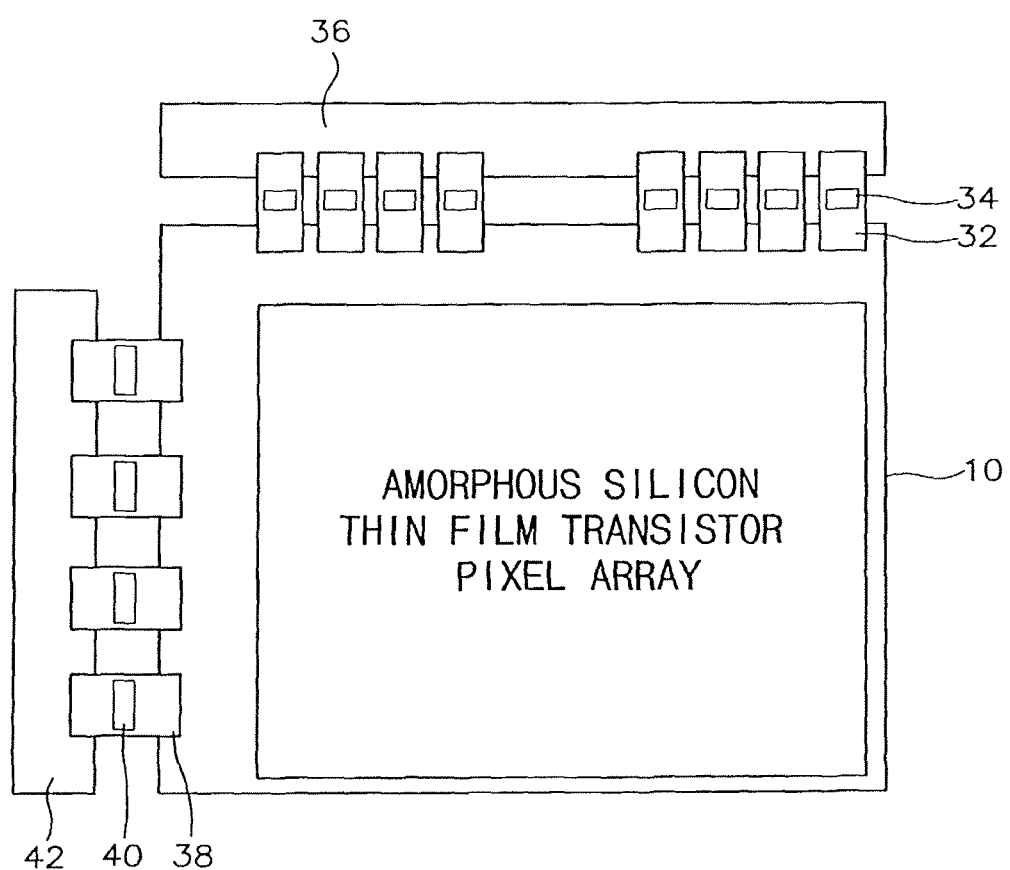
FIG. 2 is a plan view schematically illustrating a conventional amorphous silicon TFT-LCD device.
Figure 3:
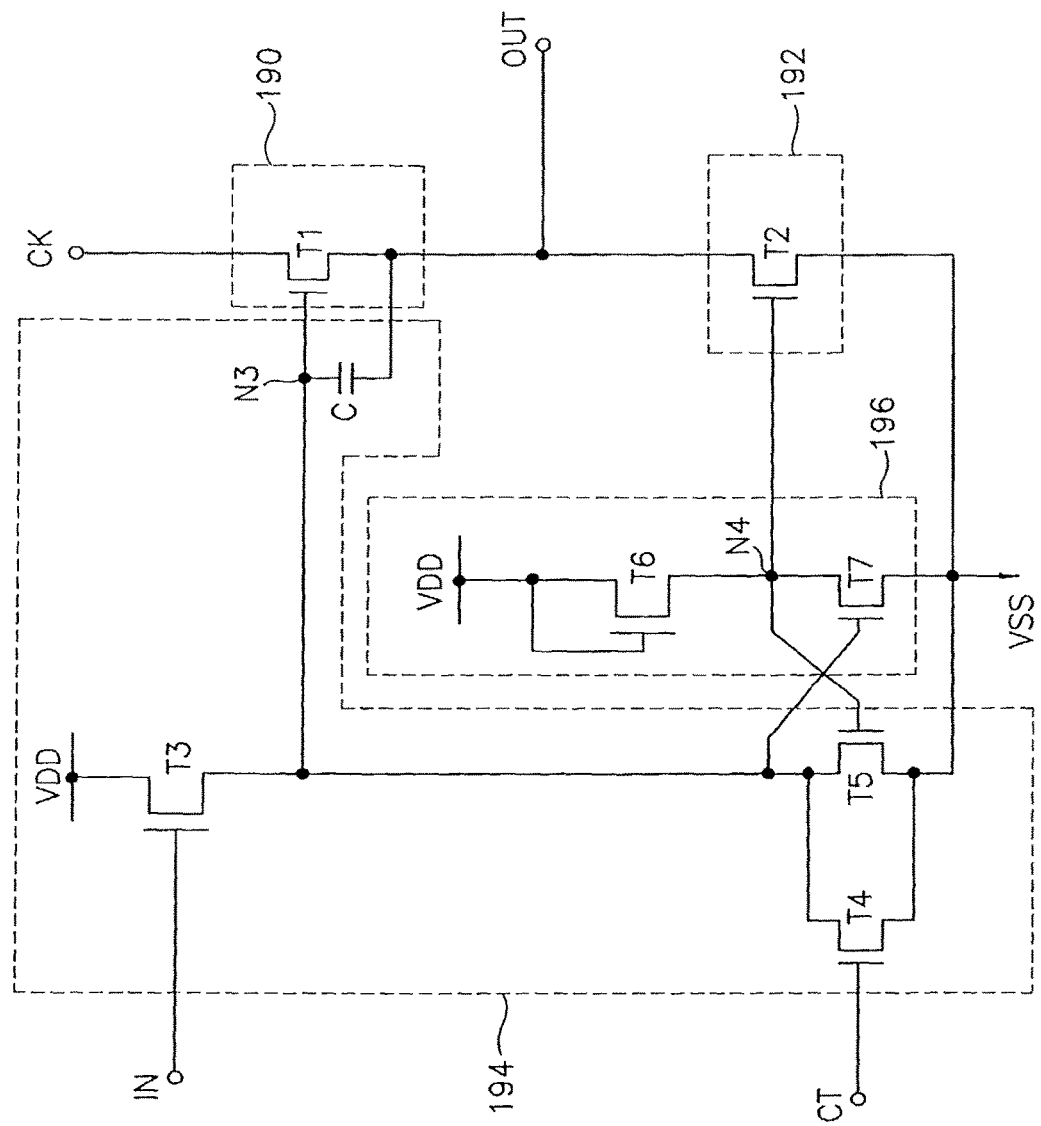
FIG. 3 is a circuit diagram of shift resistors applied to a gate driving circuit region in an amorphous silicon TFT-LCD device according to one embodiment of the present invention.
Figure 4:
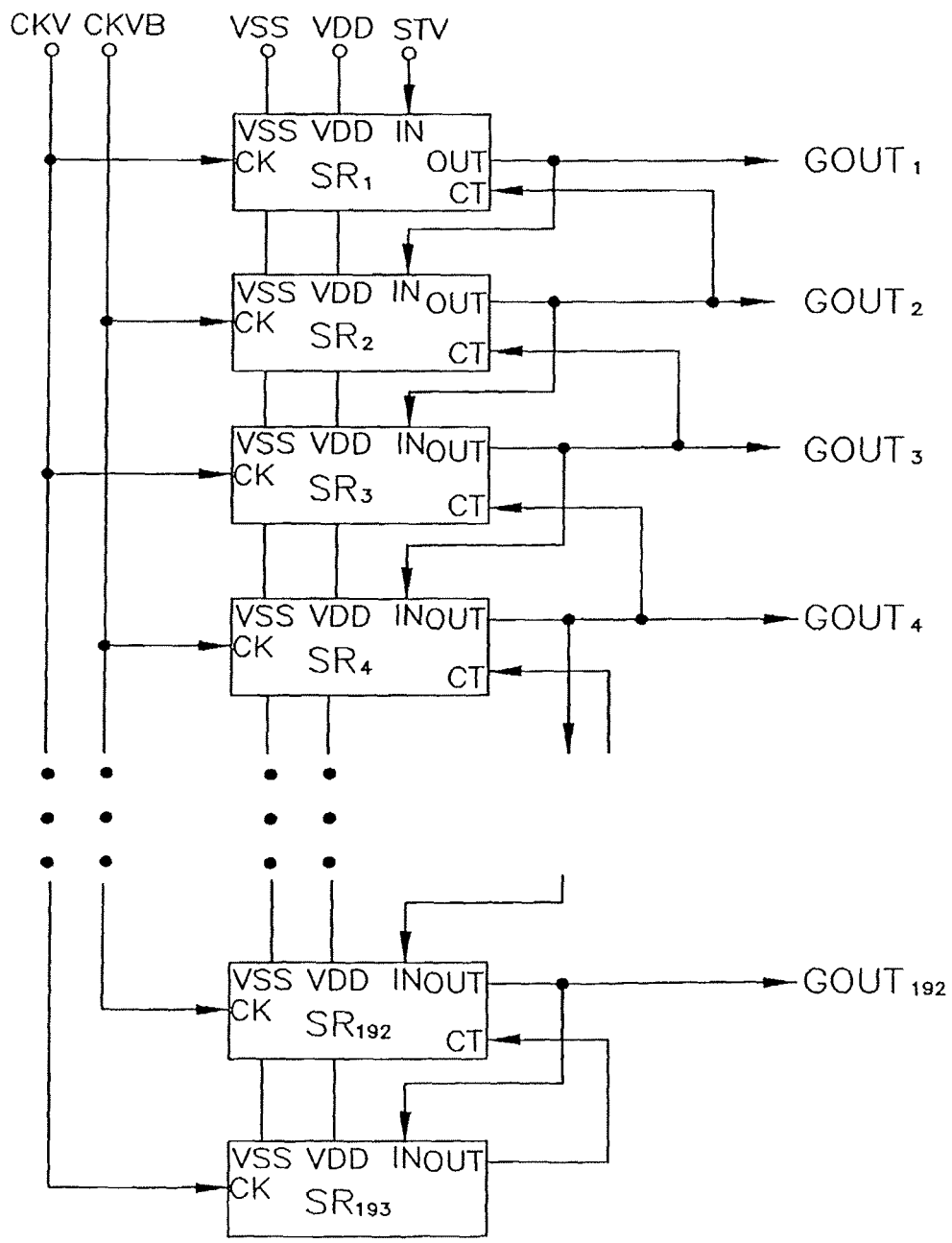
FIG. 4 is a block diagram of the shift resistors of FIG. 3.

FIG. 3 is a circuit diagram of shift resistors applied to a gate driving circuit region in an amorphous silicon TFT-LCD device according to one embodiment of the present invention. FIG. 4 is a block diagram of the shift resistors in FIG. 3.

Referring to FIGS. 3 and 4, the gate driving circuit has a plurality of shift resistors ($SR_1$, $SR_2$, ... $SR_{193}$) connected subordinately. That is, an output terminal (OUT) of each of the shift resistors is connected to an input terminal (IN) of the next shift resistor. The shift resistors have 192 shift resistors ($SR_1$~$SR_{192}$) corresponding to gate lines and one dummy shift resistor ($SR_{193}$). Each of the shift resistors has an input terminal (IN), an output terminal (OUT), a control terminal (CT), a clock signal input terminal (CK), a first power source terminal (VSS) and a second power source terminal (VDD).

A start signal (ST) is inputted to the input terminal (IN) of the first shift resistor ($SR_1$). The output signal ($GOUT_1$~$GOUT_{192}$) of each of the shift resistors is connected to the corresponding gate lines, and then, a plurality of gate lines is sequentially selected by the output signal. A first clock signal (CK) is provided to the odd-numbered shift resistors, while a second clock signal (CKB) to the even-numbered shift resistors. The phase of the first clock signal (CK) is reverse to that of the second clock signal (CKB).

Each of the shift resistors includes a pull-up section 190, a pull-down section 192, a pull-up driving section 194 and a pull-down driving section 196.

The pull-up section 190 provides a corresponding clock signal of the first and second clock signals to the output terminal (OUT). The pull-down section 192 provides the first power source (VSS) to the output terminal (OUT).

The pull-up driving section 194 is connected to the input node of the pull-up section 190 such that it responds to the end of the input signal to charge a capacitor for turning on the pull-up section 190 and responds to the end of the output signal of the next shift resistor to discharge the capacitor for turning off the pull-up section 190.

The pull-down driving section 196 is connected to the input node of the pull-down section 192 such that it responds to the end of the input signal to turn on the pull-down section 192 and responds to the end of the output signal of next shift resistor to turn off the pull-down section 192.

The pull-up section 190 includes a first driving transistor T1 having a drain connected to the clock signal input terminal CK, a gate connected to a third node N3 and a source connected to the output terminal OUT.

The pull-down section 192 includes a second driving transistor T2 having a drain connected to the output terminal OUT, a gate connected to a forth node N4, and a source connected to the clock signal input terminal CK.

The pull-up driving section 194 includes a capacitor C and three control transistors T3, T4 and T5. The capacitor C is connected between the third node N3 and the output terminal OUT. A third control transistor T3 has a drain connected to the second power source VDD, a gate connected to the input terminal IN and a source connected to the third node N3. A forth control transistor T4 has a drain connected to the third node N3, a gate connected to the control terminal CT and a source connected to the first power source VSS. A fifth control transistor T5 has a drain connected to the third node N3, a gate connected to the forth node N4 and a source connected to the first power source VSS.

The pull-down driving section 196 includes two control transistors T6 and T7. Drain and gate of the sixth control transistor T6 are connected to the second power source VDD in common, while a source to the forth node N4. The seventh control transistor T7 has a drain connected to the forth node N7, a gate connected to the third node N3 and a source connected to the first power source VSS.

Figure 5:
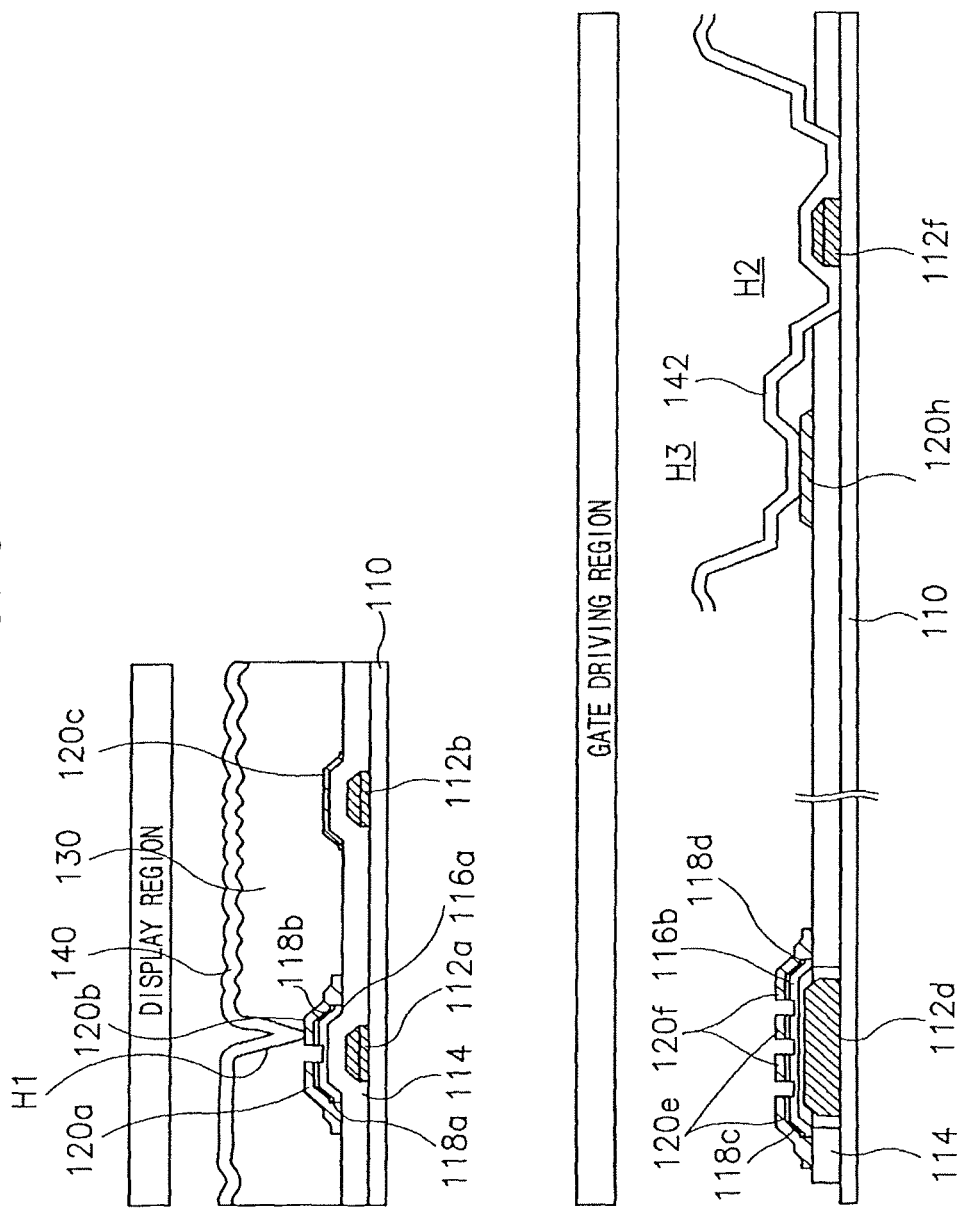
FIG. 5 is a cross-sectional view of an amorphous silicon TFT-LCD device in accordance with one embodiment of the present invention.
Figure 6:
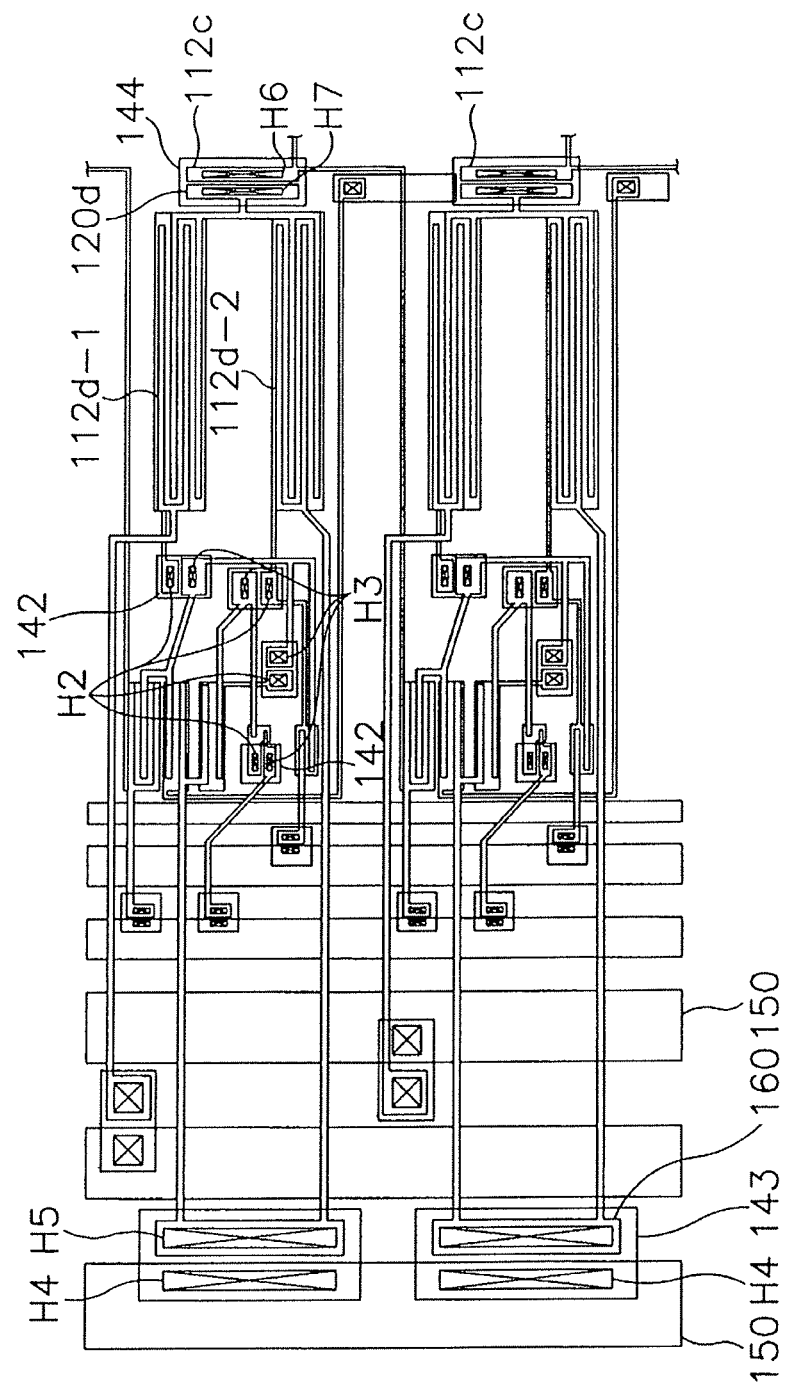
FIG. 6 is a plan view illustrating a gate driving circuit region of an amorphous silicon TFT-LCD device according to one embodiment of the present invention.

FIG. 5 is a cross-section view of the amorphous silicon TFT-LCD device according to one embodiment of the present invention and illustrates a display region and a gate driving circuit region. FIG. 6 is a plan view of the gate driving circuit region, and FIG. 7 is a plan view of the display region.

Figure 7:
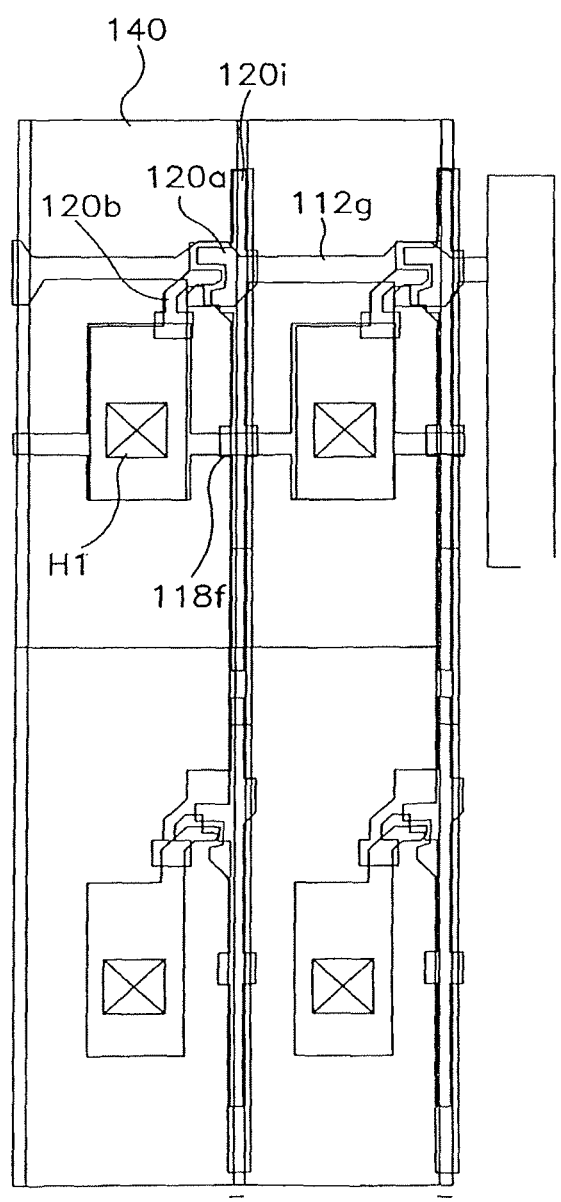
FIG. 7 is a plan view illustrating a display region of an amorphous silicon TFT-LCD device according to one embodiment of the present invention.

Referring to FIGS. 5 to 7, gate patterns 112a, 112b, 112c, 112d, 112e, 112f and 112g are disposed on the display region and the gate driving circuit region of an insulating substrate 110. Each of the gate patterns includes a gate line 112g and a gate electrode branched from the gate line 112g. Also, the gate pattern 112b in the display region is provided as a lower electrode of a storage capacitor. Between the display region and the gate driving circuit region, a gate pad 112c is formed of the same layer as in the gate pattern. The gate pad 112c is connected to one end of the gate line 112g and applies a scanning signal to the gate line 112g by receiving the scanning signal from an external source. Preferably, the gate patterns 112a, 112b, 112c, 112d, 112e, 112f and 112g are formed of a composite film consisting of a chrome (Cr) layer having a thickness of about 500 Å and an aluminum-neodymium (AlNd) having a thickness of about 200 Å.

A gate insulating film 114 is formed on the entire surface of the substrate 100 including the gate patterns 112a, 112b, 112c, 112d, 112e, 112f and 112g. The gate insulating film 114 preferably has a thickness of about 4500 Å thick and comprises silicon-nitride ($SiN_x$).

On the gate insulating film 114 of the display region and the gate driving circuit region, there are disposed active layer patterns including first impurity regions 118a and 118c, second impurity regions 118b and 118d, and channel regions 116a and 116b formed between the first impurity regions and the second impurity regions. The channel regions 116a and 116b comprises amorphous silicon and has a thickness of about 200 Å, and the first and second impurity regions 118a, 118b, 118c and 118d comprises n-type amorphous silicon and have a thickness of about 500 Å.

Data patterns 120a, 120b, 120c, 120e, 120f, 120h and 120i are disposed on the active layer patterns. The data patterns includes source electrodes 120a and 120e respectively making contact with the first impurity regions 118a and 118c, drain electrodes 120b and 120f respectively making contact with the second impurity regions 118b and 118d, and a data line 120i connected to the source electrodes 120a and 120e and formed perpendicular to the gate line 112g. Above the capacitor lower electrode 112b, there is disposed a capacitor upper electrode 120c comprising the same layer as in the data patterns with the gate insulating film 114 interposed therebetween. On the pad region between the display region and the gate driving circuit region, there is formed a data pad 120d comprising the same layer as in the data patterns. Preferably, the data patterns 120a, 120b, 120c, 120d, 120e, 120f and 120g are comprised of chrome (Cr) film having a thickness of about 1500~4000 Å.

The gate electrode 112d constituting the thin film transistor of the gate driving circuit region is formed to a box structure and the source/drain electrodes 120e and 120f are formed to an interdigital structure having multi-channels. Being spaced apart from each other, the odd-numbered source electrode 120e and the even-numbered drain electrode 120f are disposed by turns.

As shown in FIG. 6, driving transistors (T1 and T2 in FIG. 3) of the shift resistors are disposed on a portion of the gate driving circuit region adjacent to the display region. The driving transistors apply selectively signals of Von and Voff to the gate output terminal. On a part of the gate driving circuit region farthest away from the display region, there are disposed main wirings 150 (VSS, CK, CKB, VDD and VSS2) applying the signal to each of the shift resistors. Control transistors (T3, T4, T5, T6 and T7 in FIG. 3) are disposed between the driving transistor region and the wiring region.

Typically, in case that a gate output signal is formed using the shift resistors in the large-sized and fine-pitched TFT-LCD device in which a gate-on time is short and a RC delay of the gate line is very long, the resistance of the main wrings applying the signals to each of the shift resistors and the load capacitor should be minimized because the field effect mobility of the amorphous silicon TFT is very low. Accordingly, in the present invention, the first shift resistor to the last shift resistor, which correspond to the main wirings 150, are formed of the same layer without an additional contact, thereby minimizing the resistance of the main wiring 150. Particularly, in order to the wiring resistance, the main wirings 150 are formed of a metal film having a lower sheet resistance of the metal films constituting the gate patterns 112a, 112b, 112c, 112d, 112e, 112f and 112g and the data patterns 120a, 120b, 120c, 120d, 120e, 120f and 120g. In the present invention, the main wiring 150 is formed of the same layer as in the gate patterns because the gate patterns are comprised of aluminum (Al) and the data patterns are comprised of chrome (Cr).

Further, branch wirings 160 for connecting the main wiring 150 to the transistor terminals T1 to T7 of each of the shift resistors are formed of a different layer from the main wirings 150. Accordingly, if the main wirings 150 are formed of the same layer as in the gate pattern, the branch wirings 160 are formed of the same layer as in the data pattern. Also, in order to reduce the capacitance of the main wirings 150, it is preferred that a portion of the branch wiring 160s where the branch wiring 160 and the main wiring 150 cross each other is formed to have a narrow line width.

On the entire surface of the substrate 110 including the data patterns 120a, 120b, 120c, 120e, 120f, 120h and 120i, there is formed a passivation layer 130 having a first contact hole H1 exposing the drain electrode 120b of the display region, a second contact hole H2 exposing a contact gate pattern 112f in the gate driving circuit region, a third contact hole H3 exposing a contact data pattern 120h in the gate driving circuit, a forth contact hole H4 exposing one of the main wirings 150 and a fifth contact hole H5 exposing one of the branch wirings 160. Also, through the passivation layer 130 of the pad region, there are formed a sixth contact hole H6 exposing the gate pad 112c and a seventh contact hole H7 exposing the data pad 112d. The passivation layer 130 is comprised of silicon nitride or a photosensitive organic material. Especially, in a reflection-type LCD having a reflective electrode of uneven-shape for increasing the reflectivity, the passivation layer is formed of a photosensitive organic film having an uneven surface with prominences and recesses.

The electrode patterns 140, 142 and 143 are formed on the passivation layer 130 including the first to fifth contact holes H1, H2, H3, H4 and H5. The electrode patterns includes a pixel electrode (or a first electrode) 140 electrically connected with the drain electrode 120b of the display region, a second electrode 142 electrically connecting the gate pattern 112f for contact and the data pattern 112h for contact in the gate driving circuit region through the second and third contact holes H2 and H3, a third electrode 143 electrically connecting the main wiring 150 and the branch wiring 160 in the gate driving circuit region through the forth and fifth contact holes H4 and H5, and a forth electrode 144 electrically connecting the gate pad 112c and the data pad 120d through the sixth and seventh contact holes H6 and H7. Preferably, the second electrode 142 includes a first pattern connecting the gate electrode and the source/drain electrode of the first transistor constituting the shift resistor to each other, and a second pattern connecting the gate electrode of the second transistor constituting the shift resistor to the source/drain electrodes of the third transistor. In the present embodiment, the second electrode 142 in the contact region and the forth electrode pattern 144 in the pad region electrically connect a portion of the gate pattern with a portion of the data pattern, so that the second and the forth electrodes 142 and 144 are regarded as the same kind of contact terminal.

It is preferred that the forth and fifth contact holes H4 and H5 are formed to have a line width wider than that of the branch wirings 160 in order to reduce the contact resistance between the third electrode and the main wirings 150 and the branch wirings 160. Further, the forth and fifth contact holes H4 and H5 are formed so as to be located in a liquid crystal layer region within a seal line used for attaching the TFT substrate to the color filter substrate or to be located under the seal line, thereby preventing metal corrosion from being caused when the seal line is exposed to an external atmosphere.

In a transmission type LCD device, the electrode patterns 140 and 142 are formed of a transparent conductive film, e.g., an indium-tin oxide (ITO) film or an indium-zinc oxide (IZO) film. In a reflection type LCD device, the electrode patterns are formed of an opaque conductive film having high reflectivity, e.g., aluminum alloy film or silver film.

Hereinafter, a method of manufacturing an amorphous silicon TFT-LCD device according to the present invention will be described in detail with reference to the accompanying drawings.

FIGS. 8A to 11B are plan views explaining a method of manufacturing an amorphous silicon TFT-LCD device according to the present invention. Here, each figure labeled "A" is a plan view illustrating an unit process in a gate driving circuit region, and each figure labeled "B" is a plan view illustrating an unit process in a display region.

Figure 8A:
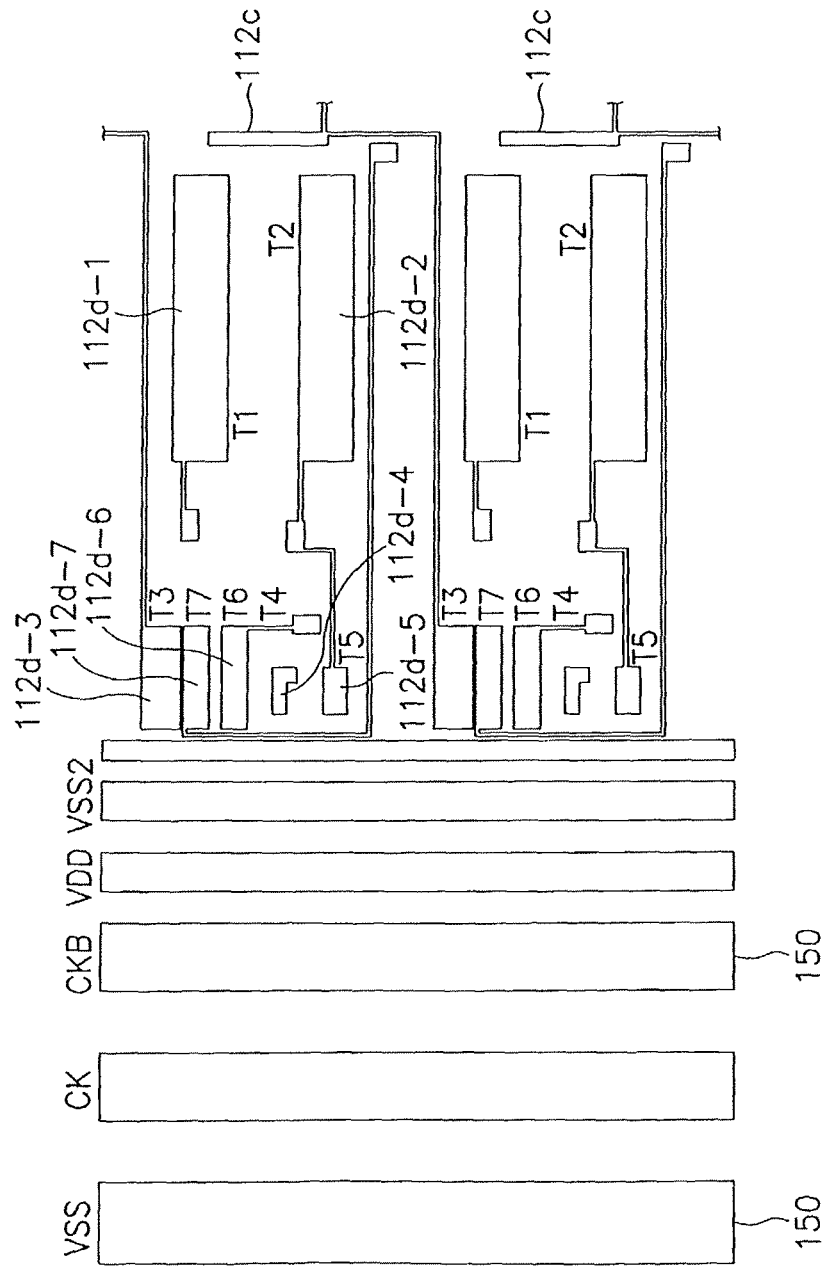
Figure 8B:
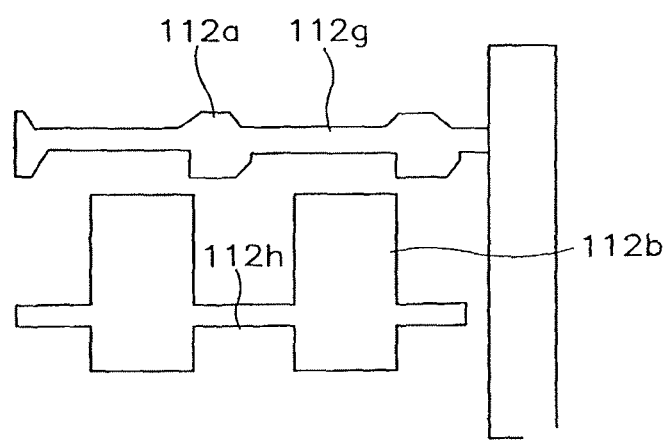

Referring to FIGS. 8A and 8B, a metal film comprising a chrome (Cr) layer having a thickness of about 500 Å and an aluminum-neodymium (AlNd) layer having a thickness of about 2500 Å is deposited on a substrate consisting of an insulating material such as glass, quartz or ceramic. Then, the metal film is patterned through a photolithography process using a first mask, thereby forming gate patterns 112.

The gate patterns 112 in the display region include a gate line 112g disposed in a first direction (i.e., a horizontal direction), a capacitor lower wiring 112h disposed between the adjacent gate lines 112g to be arranged parallel with the gate line 112g, a capacitor lower electrode 112b overlapped with the capacitor lower wiring and formed in the unit pixel region, and a gate electrode 112a branched from the gate line 112g. When the capacitor lower wiring 112h is formed separately from the gate line 112g as in this embodiment, the load capacitor of the gate output terminal of the shift resistor can be reduced to about ½~⅓ in comparison with the front gate structure.

Between the display region and the gate driving circuit region, there is formed a gate pad 112c comprised of the same layer as in the gate pattern. The gate pad 112c is connected to one end of the gate line 112g and applies a scanning signal received from an external source to the gate line 112g.

Gate electrodes 112d-1 and 112d-2 of a first driving transistor T1 and a second driving transistor T2 in each of the shift resistors disposed on the gate driving circuit region, have a wider line width than those of the gate electrodes 112d-3, 112d-4, 112d-5, 112d-6 and 112d-7 of a third to a seventh control transistor T3 to T7.

Also, in order to minimize the wiring resistance, main wirings 159 comprised of the same layer as in the gate pattern 112 are formed on the substrate of the gate driving circuit region. Preferably, the main wirings 150 are formed of the same layer from the corresponding first shift resistor to the corresponding last shift resistor without an additional contact.

Figure 9B:
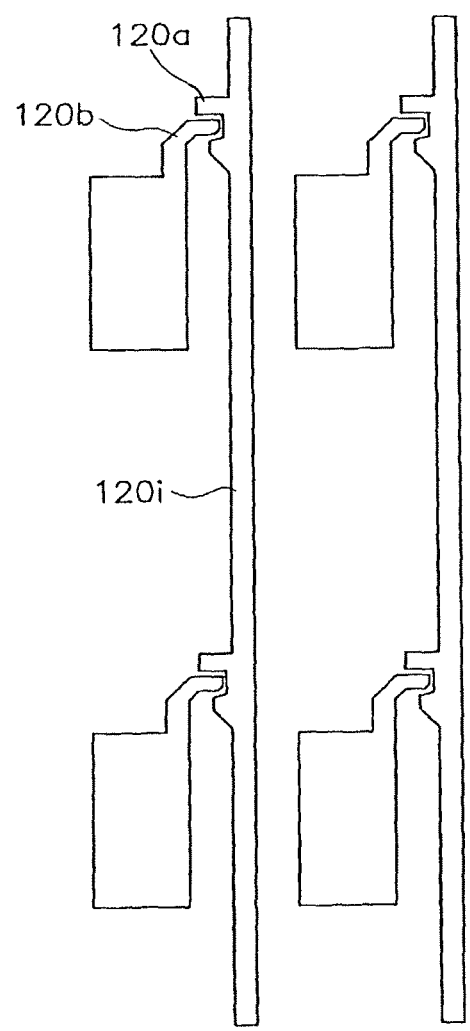

Referring to FIGS. 9A and 9B, after forming the gate patterns 112 and the main wirings 150 as described above, silicon nitride is deposited to a thickness of about 4500 Å by a PECVD method to thereby form a gate insulating film (see reference numerals 114 in FIG. 5).

Then, the active layer patterns (see reference numerals 116 and 118 in FIG. 5) are formed on the gate insulating film 114 through a photolithography process using a second mask. Specifically, an amorphous silicon film is deposited on the gate insulating film 114 to a thickness of about 2000 Å by PECVD, and an n+ doped amorphous silicon film is deposited to a thickness of about 500 Å by PECVD on the amorphous silicon film. Then, through a photolithography process using the second mask, the films are patterned to form the active layer patterns including a channel region 116 comprising the amorphous silicon film and first and second impurity regions (i.e., source/drain regions) 118 comprising the n+ doped amorphous silicon film. Here, the active layer pattern of the first and second driving transistors connected to the output terminal of the gate driving circuit region has a wider line width than those of the active layer pattern of the third to seventh control transistors.

Then, after depositing a chrome (Cr) film to a thickness of about 1500 Å on the entire surface of the substrate including the active patterns 116 and 118, the chrome film is patterned through a photolithography process using a third mask. As a result, there are formed data patterns 120 including a data line 120i disposed in a second direction perpendicular to the gate line 112g (i.e., a vertical direction), and source/drain electrodes 120a and 120b, which are overlapped with the first and second impurity regions 118a and 118b, respectively. Here, in order to secure sufficient capacity, the drain electrode 120b is formed to be overlapped with the capacitor lower electrode 112i as shown in FIG. 9.

As shown in FIG. 9A, a data pad 120d adjacent to the gate pad 112c is formed on the gate driving circuit region. The gate pad 112c and the data pad 120d are electrically connected to each other by a contact pattern that will be formed together with a pixel electrode of the display region. Further, on the substrate of the gate driving circuit region, the branch wirings 160 comprised of the same layer as in the data pattern 120 are formed to cross the main wirings 150. In order to reduce the capacitance of the main wirings 150, a portion of the branch wirings 160 where the branch wring 160 and the main wiring 150 cross each other is formed to have a narrow line width.

Preferably, the source/drain electrodes 120e and 120f of the first driving transistor T1 and the second driving transistor T2 of each of the shift resistors disposed in the gate driving circuit region are formed to have an interdigital structure. In other words, the even-numbered electrodes 120e are commonly connected to the left-side source pad and the odd-numbered electrodes 120f are commonly connected to the right-side drain pad. The even-numbered electrodes 120e are disposed between the odd-numbered electrodes 120f. The interdigital structure of the source/drain electrodes of the first and second driving transistors T1 and T2 increases the channel width of the driving transistor within the limited area, so that a driving ability of the transistor comprising amorphous silicon can be sufficiently secured.

Referring to FIGS. 10A and 10B, after forming the data pattern 120 and the branch wirings 160 as described above, a passivation layer 130 is formed on the entire surface of the resultant structure. The passivation layer 130 is formed of an inorganic insulating material such as silicon oxide, silicon nitride or a combination thereof, or a photosensitive organic insulating material.

Then, the passivation layer 130 is partially etched away through a photolithography process using a fourth mask to thereby form contact holes H1 to H7. That is, there are formed a first contact hole H1 exposing the drain electrode 120b of the display region, a second contact hole H2 exposing the gate pattern 112f for contact in the gate driving circuit region, a third contact hole H3 exposing the data pattern 120h for contact in the gate driving circuit region, a fourth contact hole H4 exposing the main wiring 150 and a fifth contact hole exposing the branch wiring 160. In addition, there are formed sixth and seventh contact holes H6 and H7 exposing the gate pad 112c and the data pad 120d, respectively. The sixth and seventh contact holes H6 and H7 can be classified into the contact holes exposing the contact gate pattern and the contact holes exposing the contact data pattern, just like the second and third contact holes H2 and H3. Accordingly, the contact holes exposing the gate pad 112c are regarded as one of the second contact holes H2, and the contact holes exposing the data pad 112d are regarded as one of the third contact holes H3.

A pair of contact holes H2 and H3 formed adjacent to each other is electrically connected to each other by the contact electrode that will be formed together with a pixel electrode formed in the display region.

In a reflection type LCD device having a reflective electrode of an uneven structure, numerous uneven structures are formed in the surface of the passivation layer 130 during the formation of the contact holes.

Figure 11B:
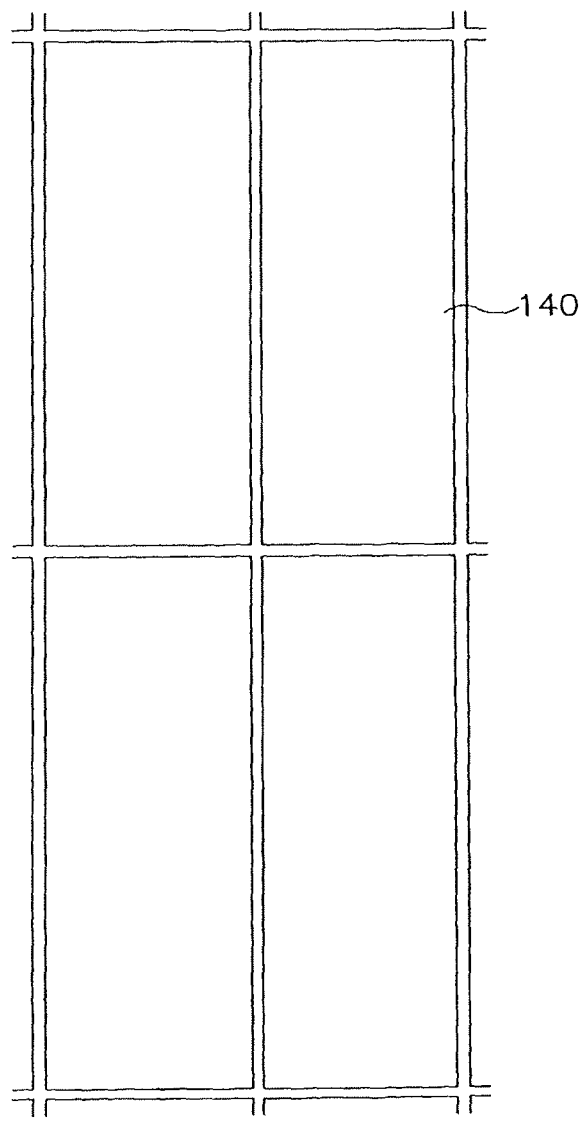

Referring to FIGS. 11A and 11B, after forming the contact holes as mentioned above, a metal film for pixel electrode, e.g., a transparent conductive film such as an ITO film or an IZO film, or an opaque reflective film such as an Al alloy film or a silver film, is deposited on the entire surface of the resultant structure. Then, the metal film is patterned through a photolithography process using a fifth mask, to thereby form the pixel electrode (or the first electrode) 140 electrically connected to the drain electrode 120b through the first contact hole H1 in the display region. In the gate driving circuit region, a second electrode 142 is formed so as to electrically connect the contact gate pattern 112f and the contact data pattern 112h through the second and third contact holes H2 and H3. Also, a third electrode 143 is formed so as to electrically connect one of the main wirings 150 and one of the branch wirings 160 through the forth and fifth contact holes H4 and H5. In the pad region located between the display region and the gate driving circuit region, a fourth electrode 144 is formed so as to electrically connect the gate pad 112c and the data pad 112d through the sixth and seventh contact holes H6 and H7.

In the embodiment abovementioned, the amorphous silicon TFT-LCD is manufactured using masks of 5 sheets. However, according to another embodiment of the present invention, the number of the mask used for manufacturing an amorphous silicon TFT-LCD can be decreased down to 4 sheets by simultaneously forming active layer patterns and data patterns using one mask.

In detail, after forming the gate insulating film, an undoped intrinsic amorphous silicon film and an n-type doped extrinsic amorphous silicon film are successively deposited on the gate insulation film. After a metal film for data patterns is deposited on the entire surface of the extrinsic amorphous silicon film, a positive photosensitive film is coated to a predetermined thickness thereon and then, a mask is arranged above the photosensitive film.

In the mask, light-shielding regions correspond source, drain and channel regions and light-transmitting regions correspond the other regions. Particularly, the light-transmitting region between the channel region and the source region and the light-transmitting region between the channel region and the drain region have a slit structure. Since light passing theses slits is diffracted, the gap of the slits is controlled narrower than that of the channel region. The ultraviolet rays passing the slit are diffracted to expose the photosensitive film located on the channel region. At the same time, the exposed photosensitive film of the other region is exposed to the UV rays.

The exposed photosensitive film is developed to form a photosensitive pattern where a portion corresponding to the channel region is removed to a predetermined depth. When the dry etching process is performed using the photosensitive pattern as an etching mask, the exposed metal film on which no photosensitive film is coated and the underlying extrinsic amorphous silicon film and intrinsic amorphous silicon film are removed away. At this time, the photosensitive film pattern on the channel region is also removed because it has a very thin thickness during the development process.

Next, the exposed metal film of the channel region and the underlying extrinsic amorphous silicon film are completely removed by selective etching method, while the underlying intrinsic amorphous silicon film is removed to a predetermined depth. Thereafter, the photosensitive film pattern on the source/drain regions is removed to simultaneously form the active patterns and the data patterns including the source/drain electrodes using one mask process.

According to the present invention as described above, without an additional process, the gate driving circuit including the shift resistors and the wirings is integrated on the insulating substrate on which a pixel array is formed. That is, several layers, which can be comprised of the same material, are formed of the same layer to thereby decrease the number of mask. Further, a conductive film for pixel electrode connects the gate electrode and source/drain electrodes of the first transistor constituting the shift resistors in the gate driving circuit with each other, thereby simplifying the manufacturing process.

Further, the main wirings for applying signals to the shift resistors are formed of the same layer from the first shift resistor to the last shift resistor, so that the resistance of the main wirings is minimized to increase a field effect of the amorphous silicon TFT-LCD.

Although the preferred embodiments of the present invention have been described, it is understood that the present invention should not be limited to those preferred embodiments, but various changes and modifications can be made by one skilled in the art within the spirit and scope of the invention as hereinafter claimed.

What is claimed is:

1. A substrate for a display device, comprising:
a base substrate including a display region and a driving circuit region;
a plurality of switching transistors formed in the display region, each of the switching transistors including amorphous silicon;
a plurality of driving transistors formed in the driving circuit region, each of the driving transistors including amorphous silicon;
a protection layer formed on the base substrate to cover the switching transistors and the driving transistors;
an electrode pattern formed on the protection layer, the electrode pattern including a pixel electrode electrically connected to one of the switching transistors, and a connecting electrode electrically connecting two of the driving transistors; and
main signal lines for applying signals to the driving transistors,
wherein the main signal lines comprise a first power source line and a first sub power source line in parallel with the first power source line,
wherein a first voltage is applied to the first power source line,
wherein a first sub voltage different from the first voltage is applied to the first sub power source line,
wherein the driving transistors are spaced apart from the first power source line and the first sub power source line in a plan view.

2. The substrate of claim 1, wherein the first sub power line is adjacent to the driving transistors and has a first width, and wherein the first power source line is adjacent to the first sub power source line and has a second width that is wider than the first width.

3. The substrate of claim 1, wherein the electrode pattern comprises an optically transparent and electrically conductive material.

4. The substrate of claim 3, wherein the electrode pattern comprises at least one of ITO (Indium Tin Oxide) and IZO (Indium Zinc Oxide).

5. The substrate of claim 1, wherein each of the driving transistors and the switching transistors comprises a gate electrode, a drain electrode and a source electrode, and the gate electrode and the main signal lines are made of a same material.

6. The substrate of claim 5, further comprising:
a branch signal line extended from one of the drain electrode and the source electrode, the branch signal line including a wiring portion having a third width and a connecting pad portion having a fourth width that is wider than the third width.

7. The substrate of claim 6, wherein the connecting pad portion is electrically connected to the connecting electrode.

8. The substrate of claim 1, wherein a lower surface of the connecting electrode contacts the base substrate at opposing sides of a gate pattern.

9. The substrate of claim 1, wherein a sheet resistance of the main signal lines is less than a sheet resistance of a gate pattern.

10. The substrate of claim 1, further comprising:
a branch signal line; and
an additional electrode connecting one of the main signal lines to the branch signal line through first and second contact holes in the protection layer,
wherein the first and second contact holes have line widths wider than that of the branch signal line.

11. The substrate of claim 1, wherein the connecting electrode surrounds a gate pattern of a gate electrode disposed on the base substrate.

12. The substrate of claim 1, wherein the first sub power source line is disposed between the driving transistors and the first power source line in a plan view.

13. The substrate of claim 1, further comprises a second power source line, wherein a second voltage is applied to the second power source line.

14. A liquid crystal display (LCD) device comprising:
a first substrate including:
a base substrate including a display region and a driving circuit region;
a plurality of switching transistors formed in the display region, each of the switching transistors including amorphous silicon;
a plurality of driving transistors formed in the driving circuit region, each of the driving transistors including amorphous silicon; and
a protection layer formed on the base substrate to cover the switching transistors and the driving transistors;
an electrode pattern formed on the protection layer, the electrode pattern including a pixel electrode electrically connected to one of the switching transistors, and a connecting electrode electrically connecting two of the driving transistors;
main signal lines for applying signals to the driving transistors;
a second substrate facing the first substrate; and
a liquid crystal layer disposed between the first and the second substrates,
wherein the main signal lines comprise a first power source line and a first sub power source line in parallel with the first power source line,
wherein a first voltage is applied to the first power source line,
wherein a first sub voltage different from the first voltage is applied to the first sub power source line, and
wherein the driving transistor are spaced apart from the first power source line and the first sub power source line in a plan view.

15. The LCD device of claim 14, wherein the first sub power line is adjacent to the driving transistors and has a first width, and wherein the first power source line is adjacent to the first sub power source line and has a second width that is wider than the first width.

16. The LCD device of claim 14, wherein the electrode pattern comprises an optically transparent and electrically conductive material.

17. The LCD device of claim 16, wherein the electrode pattern comprises at least one of ITO (Indium Tin Oxide) and IZO (Indium Zinc Oxide).

18. The LCD device of claim 14, wherein each of the driving transistors and the switching transistors comprises a gate electrode, a drain electrode and a source electrode, and the gate electrode and the main signal lines are made of a same material.

19. The LCD device of claim 18, further comprising: a branch signal line extended from one of the drain electrode and the source electrode, the branch signal line including a wiring portion having a third width, and a connecting pad portion having a fourth width that is wider than the third width.

20. The LCD device of claim 19, wherein the connecting pad portion is electrically connected to the connecting electrode.

* * * * *